US008483866B2

(12) United States Patent
Huang et al.

(10) Patent No.: US 8,483,866 B2
(45) Date of Patent: Jul. 9, 2013

(54) AUTOMATED MATERIALS HANDLING SYSTEM HAVING MULTIPLE CATEGORIES OF OVERHEAD BUFFERS (75) Inventors: Chih-Wei Huang, Hsinchu County (TW); Wen-Chi Chien, Miaoli County (TW); Chi-Chau Su, Banqiao (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 1045 days.

(21) Appl. No.: 12/433,581

(22) Filed: Apr. 30, 2009

(65) Prior Publication Data

US 2010/0278622 A1 Nov. 4, 2010

(51) Int. Cl.
*H01L 21/67* (2006.01)

(52) U.S. Cl.
USPC ....... 700/214; 414/560; 414/222.01; 198/348

(58) Field of Classification Search
USPC .......................................... 700/214
See application file for complete search history.

(56) References Cited

U.S. PATENT DOCUMENTS

| | | | |
|---|---|---|---|
| 6,854,583 B1 * | 2/2005 | Horn ............................. | 198/348 |
| 7,099,739 B2 | 8/2006 | Chen et al. | |
| 7,356,378 B1 | 4/2008 | Huang et al. | |
| 7,441,999 B2 | 10/2008 | Nakao et al. | |
| 2004/0267641 A1 * | 12/2004 | Chang et al. ..................... | 705/28 |
| 2005/0125095 A1 | 6/2005 | Chen et al. | |
| 2005/0216115 A1 * | 9/2005 | You et al. ....................... | 700/213 |
| 2006/0051188 A1 | 3/2006 | Hoshino | |
| 2007/0264114 A1 * | 11/2007 | Ma et al. ....................... | 414/560 |
| 2007/0276530 A1 * | 11/2007 | Duffin et al. ................... | 700/112 |
| 2008/0228310 A1 | 9/2008 | Wang et al. | |
| 2009/0035102 A1 | 2/2009 | Zimmerhackl et al. | |
| 2009/0196716 A1 * | 8/2009 | Rebstock ................. | 414/222.01 |

* cited by examiner

*Primary Examiner* — Gene Crawford
*Assistant Examiner* — Kyle Logan
(74) *Attorney, Agent, or Firm* — Duane Morris LLP (57) ABSTRACT An automated materials handling system comprises a plurality of overhead hoist buffers (OHBs) for receiving a plurality of semiconductor wafer carriers. Each OHB is assigned to a respective one of a plurality of categories. Each wafer carrier is associated with one or more of the plurality of categories. Each respective category is associated with at least one of a plurality of event trigger types. An overhead transport (OHT) if provided for transporting each of the plurality of wafer carriers to a respective one of the OHBs in response to a respective trigger event. Each trigger event has one of the plurality of event trigger types. Each wafer carrier is stored in a respective one of the plurality of OHBs assigned to a respective one of the categories associated with the respective event trigger type of the trigger event causing that wafer carrier to be transported and stored.

19 Claims, 5 Drawing Sheets

AUTOMATED MATERIALS HANDLING SYSTEM HAVING MULTIPLE CATEGORIES OF OVERHEAD BUFFERS

FIELD OF THE INVENTION

The present disclosure is related to an automated materials handling system (AMHS) for a semiconductor fabrication facility.

BACKGROUND

The manufacture of semiconductor devices involves the performance of a series of process steps using a variety of high tech production and metrology tools in a certain order and often within a certain period of time. The primary function of a wafer logistics system in a semiconductor fabrication facility, or "fab," is to deliver the wafers to each of the tools at the right time, as well as to track the location and status of the wafers throughout the process.

Automated material handling systems ("AMHS") are used in fabs to carry out the automated functions more efficiently, consistently, and safely than can be done via manual means. Process and tool changes have placed additional demands on the AMHS. Such demands include the necessity for cross-floor and cross-phase transportation and increased transportation volume, the combination of which often results in traffic jams, delays, and lower tool utilization.

When a wafer carrier, such as a standard mechanical interface (SMIF) pod or front opening unified pod ("FOUP") containing wafers is to be transferred, a manufacturing execution system ("MES") determines to what destination in the fab the wafer carrier should be transferred. Once the destination decision has been made, the MES sends a transfer request to a material control system ("MCS"), which calculates a detailed transportation route using a real time dispatching (RTD) system and then notifies a transfer manager to execute the transfer step-by-step. AMHS's have been used extensively in the semiconductor fabrication field.

Figure 1:
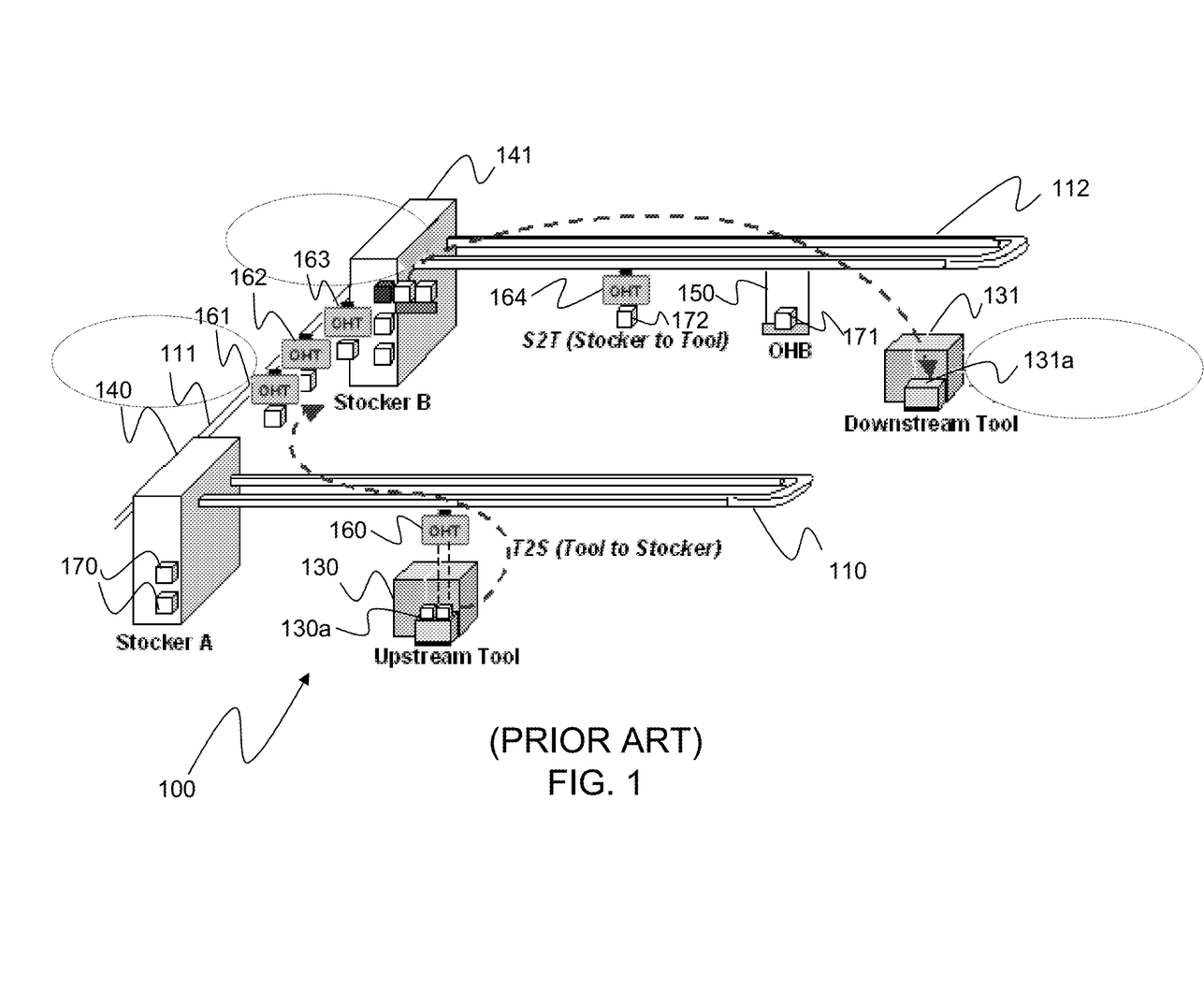
FIG. 1 is a diagram of a conventional AMHS.

FIG. 1 is a diagram of a portion of a conventional automated materials handling system (AMHS) 100. The typical system includes a plurality of bays (rows) of storage areas. Each bay has a stocker 140, 141, which includes bins for holding a plurality of wafer carriers 170-172, such as standard mechanical interface (SMIF) containers for loading 200 mm (8 inch) wafers, or front opening unified pods (FOUPs), which may be used to load 300 mm (12 inch) wafers. The stockers 140, 141 hold the SMIFs or FOUPs 170-172 in preparation for transporting a SMIF or FOUP to the loadport of a processing tool 130, 131.

An overhead hoist transport (OHT) 110, 112 associated with each bay transports the SMIF or FOUP with wafers from a respective stocker 140 or 141 to a loadport of its respective tool 130 or 131, for processing in one of the tools (fabrication process machines). The OHTs 110, 112 have a plurality of intra-bay overhead transport (OHT) vehicles 160, 164 for transporting wafer carriers 170, 171 between tools 130, 131 and their respective local stockers 140, 141. An inter-bay OHT 111 is provided between stockers 140, 141. Additional inter-bay overhead transport (OHT) vehicles 161-163 are provided for transporting wafer carriers 170, 171 between stockers 140, 141.

Because the availability of wafers to be processed at the time the equipment is ready to perform the processing has a major impact on the overall production rate, it is important to operate the AMHS 100 in a manner that supplies wafers quickly as soon as they are needed (i.e., as soon as the tool is ready to receive the next wafer to be processed). A frequently used measure of the AMHS performance is the Operator Service Time (OST). The OST is an efficiency index of the AMHS 100 that measures the period of time between issuance of a retrieval command for a lot of wafers (by the load port of the processing tool) and the time when the wafers are available to the operator at the tool. One significant component of the OST is the tool load port time, which is the period between issuance of a retrieval command by the load port of the processing tool 130 or 131 and the time when the wafers are transferred to the load port of the equipment.

Figure 2:
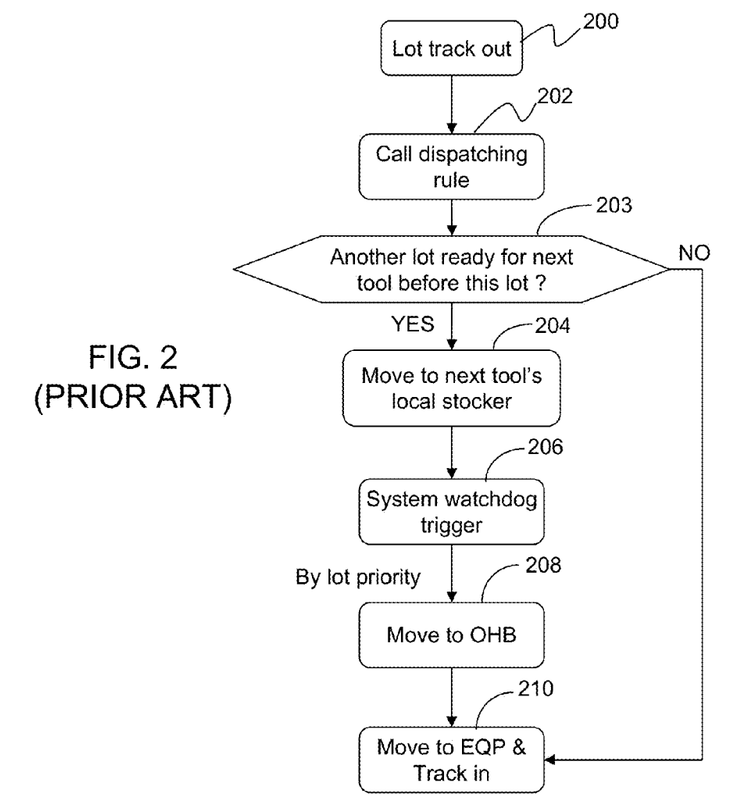
FIG. 2 is a flow chart of a method of using the OHB in FIG. 1.

To reduce the latency between the issuance of the retrieval command and the transfer of the wafers to the load port, an overhead hoist buffer (OHB) 150 was set up to provide a temporary storage function in AMHS 100. The OHB 150 is physically closer to the downstream tool 131 than the local stocker 141. Also, transferring a wafer carrier from OHB 150 to an OHT vehicle 164 takes less time than transferring the wafer carrier from a storage slot within stocker 141 to the vehicle 164 (which also includes time to transfer the wafer carrier internally, to the output port of the stocker). FIG. 2 is a flow chart showing the operation of the OHB 150.

At step 200, a lot is tracked out from upstream tool 130. The wafer lot has finished process in upstream tool 130 and is ready to go to the next process in tool 131.

At step 202, the dispatch rule determines the next destination tool.

At step 203, if tool 131 is available, and this lot is the next one to be processed by the downstream tool 131, then step 210 is performed next, and the lot is transferred directly to the loadport 131a of the next tool 131. If tool 131 is not available, (e.g., if there is another wafer lot ready to be used by downstream tool before this wafer lot), step 204 is performed next.

At step 204, this wafer lot is sent to the local stocker 141 for the next tool 131.

At step 206, a system watchdog function (not shown) periodically checks whether the OHB 150 is empty. When the system watchdog determines that the OHB 150 is empty and that the local stocker 141 has a wafer lot ready to be processed by tool 131, then step 208 is performed.

At step 208, the system watchdog triggers the OHT 112 to transfer this lot from local stocker 141 to OHB 150.

At step 210, when the load port 131a of the tool 131 is available, the wafer carrier is transferred from the OHB 150 to the load port 131.

Using the prior art system and method, if the OHB 150 is already filled, then it cannot accept another wafer carrier. This may reduce overall wafer lot performance of tool 131.

SUMMARY OF THE INVENTION

In some embodiments, a method comprises providing an automated materials handling system having a plurality of overhead hoist buffers (OHBs) for receiving a plurality of semiconductor wafer carriers. Each OHB is assigned to a respective one of a plurality of categories, each wafer carrier being associated with one or more of the plurality of categories. Each respective category is associated with at least one of a plurality of event trigger types. Each of the plurality of wafer carriers is stored in response to a respective trigger event. Each trigger event has one of the plurality of event trigger types. Each wafer carrier is stored in a respective one of the plurality of OHBs assigned to a respective one of the categories associated with the respective event trigger type of the trigger event causing that wafer carrier to be stored.

In some embodiments, an automated materials handling system comprises a plurality of overhead hoist buffers (OHBs) for receiving a plurality of semiconductor wafer carriers. Each OHB is assigned to a respective one of a plurality of categories. Each wafer carrier is associated with one or more of the plurality of categories. Each respective category is associated with at least one of a plurality of event trigger types. An overhead transport (OHT) if provided for transporting each of the plurality of wafer carriers to a respective one of the OHBs in response to a respective trigger event. Each trigger event has one of the plurality of event trigger types. Each wafer carrier is stored in a respective one of the plurality of OHBs assigned to a respective one of the categories associated with the respective event trigger type of the trigger event causing that wafer carrier to be transported and stored.

In some embodiments, a machine readable medium is encoded with computer program code, such that when the computer program code is executed by a processor, the processor performs a method for controlling an automated materials handling system having a plurality of overhead hoist buffers (OHBs) for receiving a plurality of semiconductor wafer carriers. The method comprises assigning each OHB to a respective one of a plurality of categories. Each wafer carrier is associated with one or more of the plurality of categories. each respective category is associated with at least one of a plurality of event trigger types. The automated materials handling system is controlled for storing each of the plurality of wafer carriers in response to a respective trigger event. Each trigger event has one of the plurality of event trigger types. Each wafer carrier is stored in a respective one of the plurality of OHBs assigned to a respective one of the categories associated with the respective event trigger type of the trigger event causing that wafer carrier to be stored.

DETAILED DESCRIPTION

This description of the exemplary embodiments is intended to be read in connection with the accompanying drawings, which are to be considered part of the entire written description. Terms concerning attachments, coupling and the like, such as "connected" and "interconnected," refer to a relationship wherein structures are secured or attached to one another either directly or indirectly through intervening structures, as well as both movable or rigid attachments or relationships, unless expressly described otherwise.

In the 300 mm wafer fab production environment, large-scaled fab operation involves a very high production volume, and short lot cycle time. Higher equipment throughput and just-in-time delivery enable the achievement of lot cycle time and equipment productivity targets.

A semiconductor factory automation system is described herein providing differential transport service categories (e.g. super hot run (SHR), regular lot, engineering lot, tool control wafer, or the like). The provision of multiple OHB categories for multiple categories of transport service can relieve constraints due to limited AMHS capacity and/or limited equipment load port capacity.

Administrators can set up multi-function OHB categories to satisfy different operational targets/specifications. The system and method described herein can enable the AMHS to serve various categories of wafer lots within their respective delivery time targets, and avoid queuing delays. The addition of OHB categories can reduce or eliminate tool idle times, and avoid AMHS traffic jams.

Figure 4:
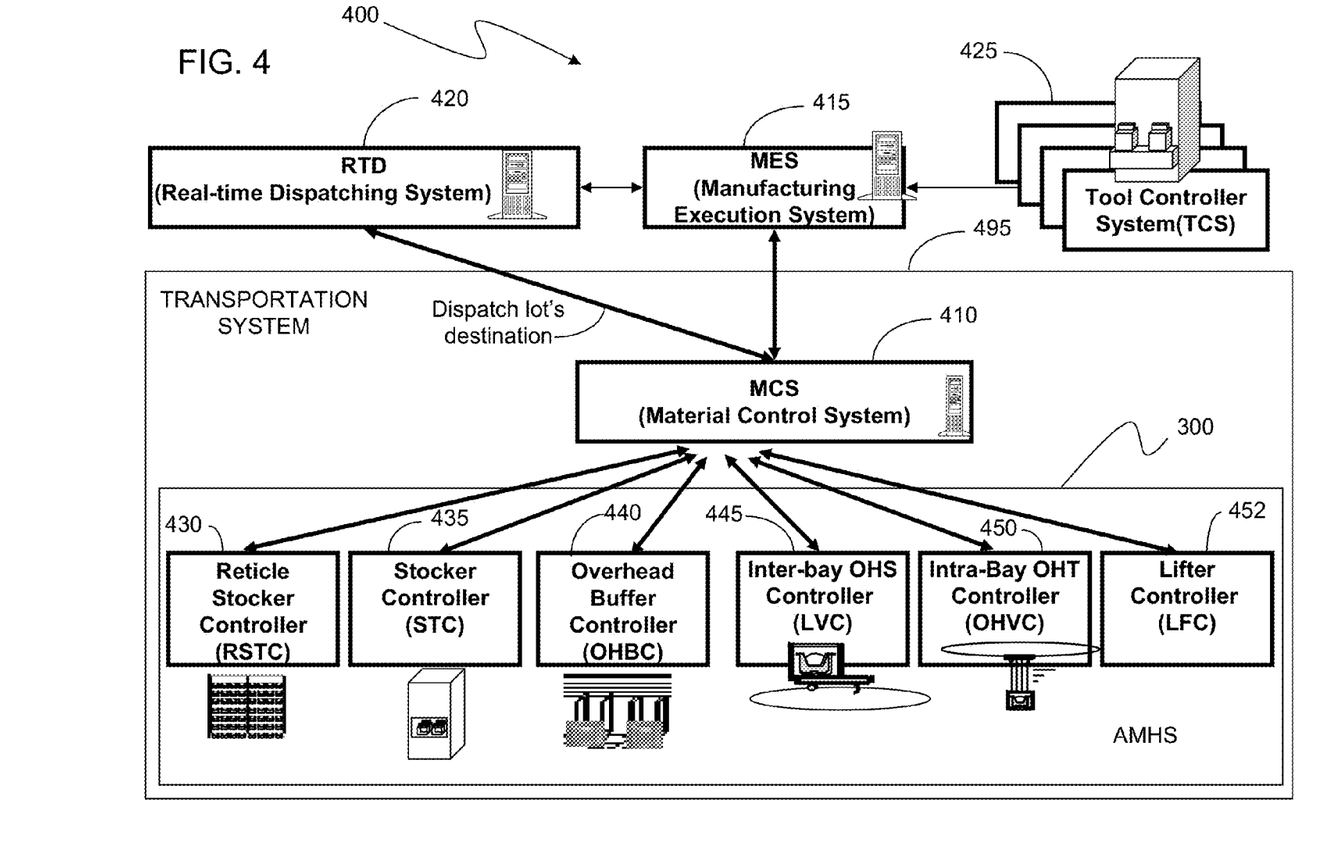
FIG. 4 is a block diagram of a factory automation system including the AMHS of FIG. 3.

FIG. 4 is a block diagram of an exemplary factory automation system 400. that may be implemented in a fab. The factory automation system 400 includes a tool controller system ("TCS") 425 with a controller for each respective tool, a manufacturing execution system ("MES") 415, a real-time dispatching system ("RTD") 420, and a transportation system 495. The transportation system 495 includes a material control system ("MCS") 410 and an automated material handling system ("AMHS") 300. The AMHS 300 includes a plurality of control modules, such as a reticle stocker controller ("RSTC") 430, a stocker controller ("STC") 435, an overhead buffer controller ("OHBC") 440, an inter-bay OHS controller ("LVC") 445, an intra-bay OHT controller ("OHVC") 450, and a lifter controller ("LFC") 452. The AMHS 300 can include additional, fewer, and different control modules in other embodiments.

As shown in FIG. 4, the TCS 425 is in communication with the MES 415. The MES 415, the RTD 420, and the transportation system 495 (including the MCS 410 and AMHS 300) are in communication with one another. The communication between the TCS 425, the MES 415, the RTD 420, and the transportation system 495 may be accomplished through any suitable method including wired and wireless connections, including but not limited to computer network and telecommunications networks. The TCS 425 is adapted to send a wafer carrier delivery request to the MES 415.

Responsive to the delivery request, the MES 415 determines the appropriate destination and generates a transfer request to move a wafer carrier between locations in the fab. Utilizing data available from the MES 415 and the transportation system 495, the RTD 420 determines an appropriate route for the wafer carrier based on a set of RTD rules. The RTD 420 selects between multiple paths, when there is more than one possible path to the same destination. RTD 420 may send multiple micro commands (MMCs) defining the appropriate transfer path to the transportation system 495 for execution. The RTD rules are used to determine the appropriate order of execution and appropriate routes for transferring wafer carriers between locations within the fab 100. The RTD rules can be implemented or changed by a manufacturing engineer or administrator. The static and dynamic data utilized by the RTD 420 may include lot information, priority information, available transport systems, available routes, traffic conditions, and other available information. The static and dynamic data may be stored in a database or kernel accessible by the RTD 420. In addition, the exemplary RTD provides user defined rule execution, lot priority and transfer destination decisions. The RTD computer program code is modified to permit delivery of wafer carriers to a plurality of OHB categories according to a set of rules, such as the rules in the examples described herein. The rules define when, and under what conditions, a wafer carrier is delivered to each category of OHB.

The MES 415 controls the wafer lot handling systems. The MES 415 provides the operator console, which may be a computer with a database management system for storing all of the control parameters input by the system administrator in a machine readable storage medium. The MES is programmed to allow the operator to define and input the OHB categories for the factory automation system into the MES, as described herein. The MES controls the disposition of individual wafer lots into the OHBs, using to the categories described herein.

The various blocks shown in FIG. 4 may be implemented in specially programmed computers or in application specific integrated circuits (ASIC). The functions described with reference to FIG. 4 may includes additional features, such as, but not limited to, those described in U.S. Pat. No. 7,356,378, which is incorporated by reference herein in its entirety.

Figure 3:
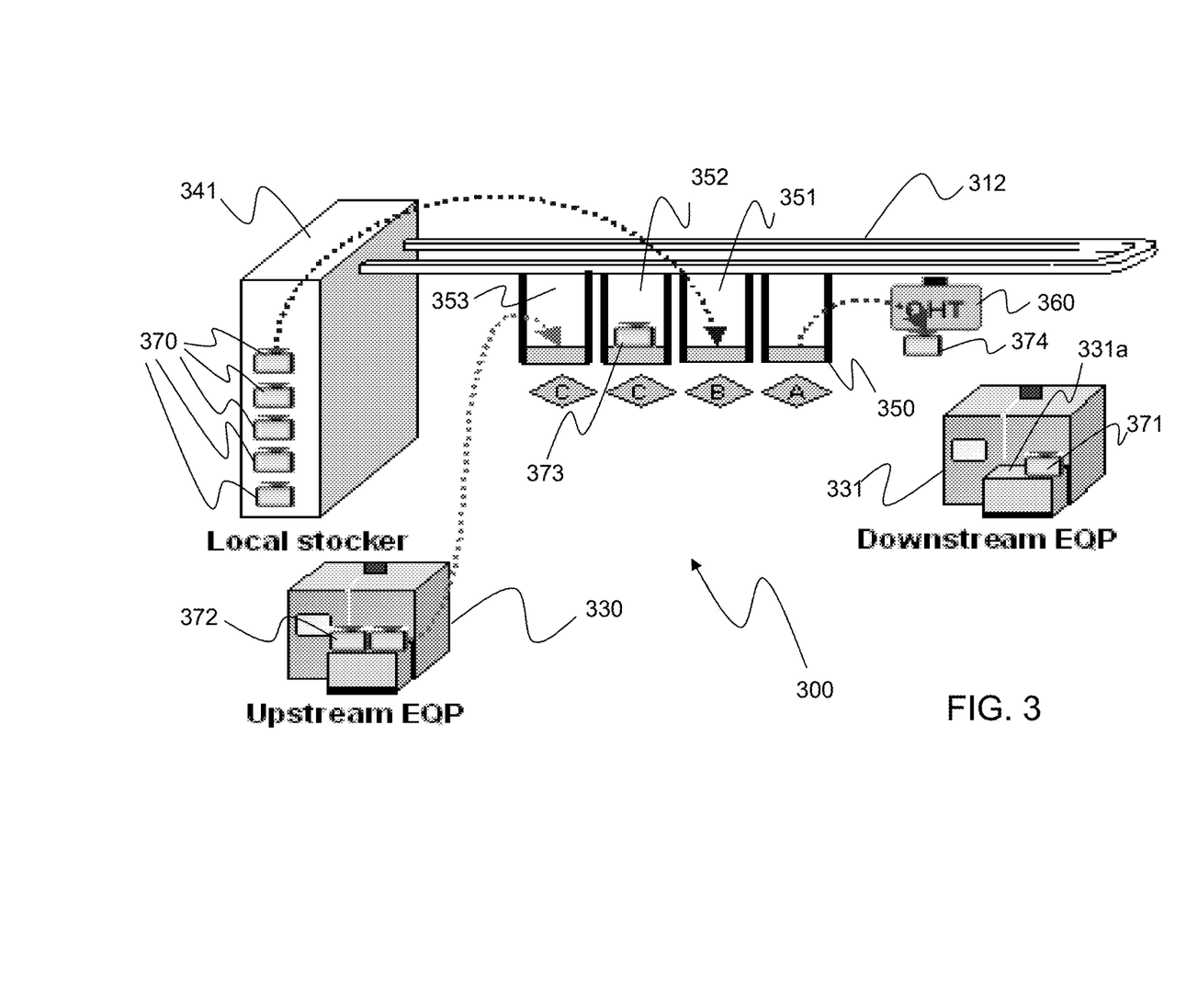
FIG. 3 is a diagram of an exemplary AMHS.

FIG. 3 is a diagram of the exemplary AMHS 300 shown in FIG. 4. The AMHS 300 includes a plurality of bays (rows) of storage areas, only one of which is shown in FIG. 3, for ease of viewing. It will be understood that the intra-bay OHT (not shown) serving upstream equipment 330 may be similar to the intra-bay OHT 110 shown in FIG. 1, and a description thereof is not repeated. Any other compatible design for the intra-bay OHT serving upstream tool 330 may be used. Each bay has a local stocker 341, which includes bins for holding a plurality of wafer carriers 370, such as standard mechanical interface (SMIF) containers for loading 200 mm (8 inch) wafers, or front opening unified pods (FOUPs), which may be used to load 300 mm (12 inch) wafers. The stocker 341 holds the SMIFs or FOUPs 370 in preparation for transporting a SMIF or FOUP to the loadport of a processing tool 331.

An overhead hoist transport (OHT) 312 associated with each bay transports the SMIF or FOUP with wafers from a respective stocker 341 to a loadport of its respective tool 331, for processing in one of the tools (fabrication process machines). The OHT 312 has an intra-bay overhead transport (OHT) vehicle 360 for transporting wafer carriers 370 between tool 331 and its respective local stocker 341. An inter-bay OHT (not shown, but similar to inter-bay OHT 111 in FIG. 1) transfers wafer carriers 370 between an upstream stocker (not shown in FIG. 3, but similar to stocker 140 in FIG. 1) and stocker 341.

The intra-bay OHT 312 has a plurality of OHBs 350-353. In some embodiments, each OHB 350-353 is a separate and distinct unit capable of storing at least one wafer carrier 373. In other embodiments, the OHBs 350-353 are included within a single physical OHB assembly with plural compartments, that permit independent direct access to any wafer carrier stored in any of the buffers. Regardless of whether the OHBs 350-353 are physically separate or connected, or otherwise integrated with each other, each buffer can be accessed independently of the others, in any order, at any time.

Each OHB 350-353 is assigned to a category, corresponding to a level or type of service. In FIG. 3, there is one OHB 350 assigned to category "A", one OHB 351 assigned to category "B", and two OHBs 352, 353 assigned to category "C". Although FIG. 3 shows an example with four OHBs 350-353, any number of two or more OHBs may be provided. Although FIG. 3 shows an example with three categories ("A," "B," and "C"), any number of two or more categories may be provided. Similarly, although FIG. 3 shows two categories ("A," and "B") having one OHB each 350, 351, and another category ("C") having two OHBs (352, 353), any desired number of OHBs may be assigned to each category.

The transfer time to transfer a wafer carrier from any of the OHBs 350-353 to an OHT vehicle 360 is the same. However, if the OHBs are located at different distances from the tool 331, the travel times for vehicle 360 between the OHB and the tool may differ slightly from each other, so the OHBs 350-353 may be physically arranged so that OHBs in a selected OHB category with the highest precedence are closest to the tool 331. For example, in FIG. 3, the Type A OHB (SHR OHB) 350 is closest to the tool 331, and has the shortest travel time between the OHB 350 and the load port 331a. Thus, a type of wafer lot for which the fastest delivery time is desired (e.g., SHR lots) may be assigned to the SHR OHB category, for which the respective OHB is located closest to the tool load port 331a.

In some embodiments, each category is associated with at least one of a plurality of event trigger types. An individual wafer carrier may be stored in one of the OHBs in response to an occurrence of a trigger event having one of the plurality of event trigger types. In some embodiments, at least one of the categories is associated with more than one event trigger type. One example is summarized in Table 1, in which there are three categories ("Super Hot Run OHB," "Equipment OHB," and "Stocker OHB") and three event trigger types ("Upstream EQP to OHB trigger by TCS," "Stocker to OHB triggered by MES," and "Stocker to OHB triggered by system watchdog").

TABLE 1

| | Category | | |
|---|---|---|---|
| Event Trigger | Type A: SHR OHB Minimum SHR cycle time | Type B: EQP OHB Maximum EQP productivity | Type C: Stocker OHB Decrease AMHS stocker traffic jam |
| Upstream EQP to OHB trigger by TCS | √ (if lot is SHR) | X | √ |
| Stocker to OHB trigger by MES | √ (if lot is SHR) | √ (if WIP qty >0) | X |
| Stocker to OHB trigger by system watchdog | √ (if lot is SHR) | √ | X |

In the example of FIG. 1, wafer lots are divided into two precedence levels: SHR lots and non-SHR lots (all other lots). At least one Type-A OHB 350 is reserved for use by SHR wafer lots. By providing a separate OHB 350 for SHR wafer lots, AMHS 100 ensures that an SHR lot does not get stuck behind a low precedence lot in a common OHB, and minimizes queuing delay for SHR lots. In some embodiments, all SHR lots are eligible to be stored in the Type-A SHR OHB 350, regardless of the trigger event that causes the wafer carrier to be stored in OHB 350. Thus, as shown in Table 1, a given SHR lot can be moved into the SHR OHB 350 upon occurrence of any of the following trigger events:

(1) Upstream EQP to OHB trigger by TCS—The trigger event occurs when an upstream tool completes processing of the given SHR wafer lot. The tool control system 425 (FIG. 4) for the upstream tool signals the occurrence of the trigger event. If an SHR OHB 350 proximate the next downstream tool is available, the given lot can be moved directly from the upstream tool to that SHR OHB.

(2) Stocker to OHB trigger by MES—The loadport 331a of the downstream tool 331 becomes available. An SHR wafer lot previously stored into the SHR OHB 350 for the downstream tool 330 is transferred to the loadport 331a, freeing up the SHR OHB 350. The Manufacturing Execution System (MES) 415 (FIG. 4) signals the occurrence of the trigger event. If an SHR wafer lot is currently being stored in the local stocker 341 for the downstream tool, the SHR lot is triggered to transfer to the SHR OHB 350.

(3) Stocker to OHB trigger by system watchdog—The SHR OHB 350 was previously made available, but there was no SHR wafer lot waiting in the stocker 341 to transfer to the SHR OHB 350 at that time. So the SHR OHB 350 is empty. The system watchdog 516 (FIG. 5) periodically (e.g., every 1 second or every 2 seconds) checks whether an SHR wafer lot has arrived in the local stocker while the SHR OHB 350 is still available. When the system watchdog detects an SHR lot in the stocker 341, while the SHR OHB 350 is still available, the system watchdog signals the occurrence of the trigger event. The SHR wafer lot currently being stored in the local stocker 341 for the downstream tool is triggered to transfer to the SHR OHB 350.

Trigger events (2) and (3) both require the availability of an OHB and the availability of a wafer carrier to be stored in that OHB. They differ in that for trigger event (2), the wafer is stored in the local stocker first, before the OHB becomes available, whereas for trigger event (3), the OHB becomes available first, before the wafer is stored in the local stocker.

The SHR OHB 350 provides a physical buffer that always allows delivery of an SHR wafer lot (if available) to an OHB in preference to a non-SHR wafer lot. Because SHR lots have a separate queue, the system enables an SHR wafer lot stored in a local stocker 341 to be delivered to the downstream tool loadport 331*a* before a non-SHR wafer carrier that is already stored in one of the other OHBs 351-353. This is accomplished by transferring the SHR lot from the local stocker to the SHR OHB 350, and then transferring the SHR lot from the SHR OHB 350 to the loadport 331*a*.

In the example of Table 1, a second category "B" is labeled equipment OHB ("EQP OHB") 351. The EQP OHB 351 is provided to maximize tool productivity (duty cycle) by shortening the OST. The EQP OHB 351 accepts wafers from the local stocker 341 of the tool 331 serviced by the EQP OHB 351. The EQP OHB 351 is closer to the tool 331 than is local stocker 341. Also, the time to transfer a wafer carrier from EQP OHB 351 to a vehicle 360 is less than the time to transfer a wafer carrier stored in stocker 341 to a vehicle 360. Thus, a wafer carrier can be transferred from OHB 351 to tool 331 in less time than it takes to transfer a wafer carrier from the stocker 341 directly to the tool 331. Thus, the tool 331 experiences less idle time when wafer carriers are buffered in EQP OHB 351. As long as there is at least one wafer lot (regardless of whether SHR or non-SHR) in stocker 341, EQP OHB 351 will accept a wafer lot from local stocker 341 and make the lot available for rapid delivery to the load port 331*a* of tool 331.

In the example of Table 1, wafer carriers are transferred from the local stocker 341 to the EQP OHB 351 upon occurrence of either of two trigger events:

(1) Stocker to OHB trigger by MES—The loadport 331*a* of the downstream tool 331 becomes available. A wafer lot previously stored into the EQP OHB 351 for the downstream tool 330 is transferred to the loadport 331*a*, freeing up the EQP OHB 351. The Manufacturing Execution System (MES) 415 (FIG. 4) signals the occurrence of the trigger event. If a wafer lot is currently being stored in the local stocker 341 for the downstream tool, the lot is triggered to transfer to the EQP OHB 350.

(2) Stocker to OHB trigger by system watchdog—The EQP OHB 351 was previously made available, but there was no wafer lot waiting in the stocker 341 to transfer to the EQP OHB 351. The system watchdog 516 (FIG. 5) periodically (e.g., every 1 second or every 2 seconds) checks whether a wafer lot has arrived in the local stocker while the EQP OHB 351 is still available. When the system watchdog detects a wafer lot in the stocker 341 while the EQP OHB 351 is still available, the system watchdog signals the occurrence of the trigger event. The wafer lot currently being stored in the local stocker 341 for the downstream tool is triggered to transfer to the EQP OHB 351.

Unlike the SHR OHB 350 and the Stocker OHBs 352, 353, the EQP OHB 351 is not made available to accept wafer lots from the output port of upstream tools. The EQP OHB 351 makes sure that as long as one wafer carrier 370 is present in the local stocker, a wafer carrier can be moved closer to the tool 331 for rapid transfer to the loadport 331*a*. Thus, the EQP OHB 351 acts as an extension or buffer for the load port of the downstream tool, and keeps the downstream tool supplied with a steady flow of wafer lots to process.

In the example of Table 1, a third category of OHB is provided. The stocker OHBs 352, 353 are made available to receive wafer carriers 372 from an upstream tool, without depositing the wafer carrier in one of the storage compartments of the local stocker 341. Thus, the stocker OHB 352, 353 can free up the robotic device (not shown) inside the stocker 341 from storing and retrieving a wafer carrier 370. This may have a significant impact in certain situations. In particular, stocker OHB 352, 353 can reduce or avoid stocker traffic jams, in cases where two or more lots would otherwise require service by the same robotic device (not shown) inside the local stocker 341, for storing or retrieving a wafer carrier in a compartment within stocker 341. More importantly, by avoiding a traffic jam in the downstream local stocker, stocker OHB 352, 353 can also prevent the traffic jam in the stocker from propagating to the load port of an upstream tool 330.

For example, in the event that an SHR lot is being transferred from the local stocker 341 to the EQP OHB 351 and a non-SHR wafer lot completes processing at an upstream tool, the non-SHR lot can be moved directly to the stocker OHB 352, 353 without being stored in stocker 341. This allows the non-SHR lot to be removed immediately from the load port of the upstream tool 330, without waiting for the robotic device of the stocker 341 to become available. By emptying the load port of the upstream tool 330, the upstream tool 330 can now transfer a completed wafer from a processing chamber (not shown) of the tool 330 to the load port of the tool 330, and transfer another wafer into the processing chamber.

In the example of Table 1, there is only one event trigger type for storing a wafer carrier in the stocker OHB 352, 353:

(1) Upstream EQP to OHB trigger by TCS—The trigger event occurs when an upstream tool completes processing of the given wafer lot. The tool control system 425 (FIG. 4) for the upstream tool signals the occurrence of the trigger event. If a stocker OHB 352, 353 proximate the next downstream tool 331 is available, the given lot can be moved directly from the upstream tool to that stocker OHB 352, 353.

Figure 5:
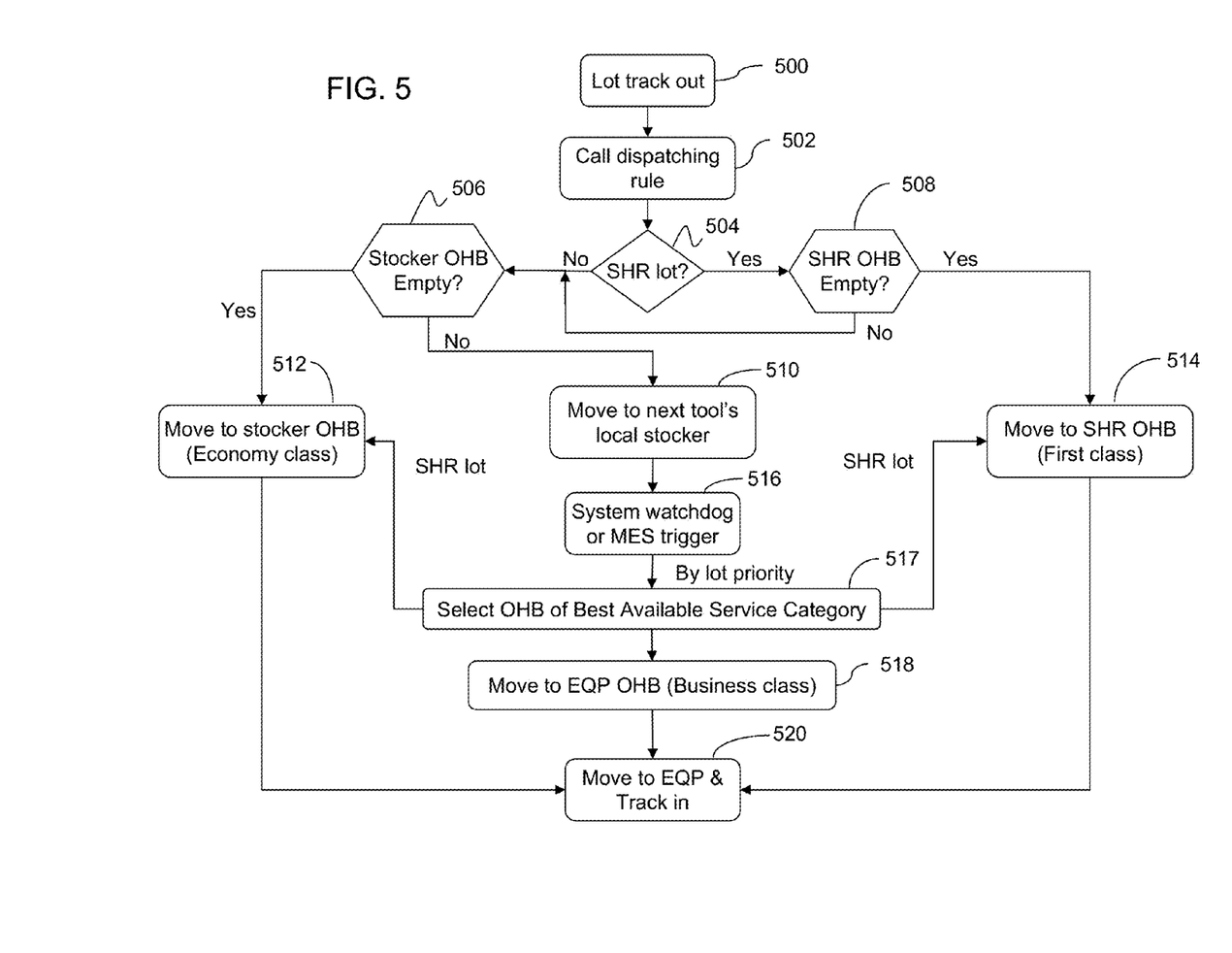
FIG. 5 is a flow chart of a method of using the OHBs in FIG. 3.

FIG. 5 is a flow chart summarizing the transfer of wafer carriers 370-373 into the various OHBs.

At step 500, a wafer carrier containing a wafer lot is tracked out from the upstream tool 330 upon completion of an upstream process.

At step 502, the dispatching rule of the upstream tool 330 is invoked to determine where to send the lot.

At step 504, a determination is made whether the lot is an SHR lot. If the lot is an SHR lot, step 506 is performed. If the lot is a non-SHR lot, step 508 is performed.

At step 506, a determination is made whether the SHR OHB 350 is empty. If the SHR OHB 350 is empty, step 514 is executed next. If the SHR OHB 350 is not empty, then step 508 is performed.

At step 508, a determination is made whether the stocker OHB is empty. If the stocker OHB is empty, step 512 is performed. If the stocker OHB is not empty, step 510 is performed.

At step 512, the wafer carrier is moved to the stocker OHB 352, 353. Thus, SHR lots are moved from the upstream tool to the SHR OHB 350 if it is available or to the stocker OHB 352, 353, if the SHR OHB 350 is not available and stocker OHB 352, 353 is available. Non-SHR lots are only moved from the upstream tool 330 to the stocker OHB 352, 353 if it is available.

At step 510, when the stocker OHB 352, 353 is not available, the wafer carrier is moved into the local stocker 341 of the downstream tool 331.

At step 516, the system waits for the MES trigger (when an SHR OHB 350 or EQP OHB 351 becomes available after a wafer carrier has been stored in the local stocker 341) or the watchdog trigger (when a wafer carrier becomes available in the local stocker 341 after an SHR OHB 350 or EQP OHB 351 becomes available). When either of these trigger events occur, step 517 is performed.

At step 517, the system selects the OHB of the best service category for which an OHB is available. If an SHR OHB 350 is available, the SHR OHB 350 is selected, and at step 514, the wafer carrier is moved into the SHR OHB. If an SHR OHB 350 is not available, but an EQP OHB 351 is available, the EQP OHB 351 is selected, and at step 518, the wafer carrier is moved into the EQP OHB.

In the case of a non-SHR wafer lot, the MES trigger and watchdog trigger will not cause a wafer lot to be transferred from the local stocker to the stocker OHB. In some embodiments, the MES trigger and watchdog trigger do not cause an SHR lot to be moved to the stocker OHB, either. However, in other embodiments, in the case of an SHR lot, if an SHR OHB 350 is not available, and an EQP OHB 351 is not available, but a stocker OHB 352, 353 is available, the stocker OHB is selected, and at step 512, the SHR wafer lot is moved into the stocker OHB.

At step 520, when the loadport 331a of downstream tool 331 becomes available, the wafer lot is moved from the OHB 350-353 in which it is stored to the loadport 331a.

Table 1 and FIG. 5 describe how OHBs of different categories can provide qualitatively different services. Also, as discussed above, two different precedence levels (SHR and non-SHR lots) are recognized by the system.

In addition to precedence levels, the AMHS 300 may provide a plurality of priority levels within the non-SHR wafer lots. For example, the non-SHR lots may include regular lots, engineering lots, and tool control wafer lots. The non-SHR wafer lots may be assigned priority levels, such as level 1 for regular lots, level 2 for engineering lots and level 3 for control wafer lots. When there is more than one wafer carrier available to be transferred to an empty OHB (e.g., multiple lots available with different priority levels in the local stocker when the EQP OHB becomes empty), the RTD 420 may select the available wafer lot having the highest priority. The system may be configured with any desired number of priority levels, such as three or five priority levels.

In some embodiments, the OHB category may be changed dynamically by an administrator using the MES 415. For example, if the utilization of the downstream tool 331 is low because of long delays in transferring wafer carriers from the local stocker 341 to the EQP OHB 351, then OHB 352 may be changed from a stocker OHB to a second EQP OHB. This may occur if the time to transfer a wafer from the stocker 341 to the EQP OHB 351 is relatively long compared to the processing time in the downstream tool 331, and relatively long compared to the transfer from the EQP OHB 351 to the downstream tool 331. By re-assigning another OHB to the EQP OHB category, the system can provide buffer storage for two wafer carriers in EQP OHB storage, to better smooth out the delivery of wafer carriers to the downstream tool 331. This is only one example. The MES 415 can dynamically change any OHB from any category to any other category at any time.

In a situation where a large number of SHR wafer lots are being processed, and the administrator wishes to change an EQP OHB 351 or stocker OHB 352 to a second SHR OHB, the OHB 351 or 352 that is to be changed may currently store a non-SHR wafer lot. It is desirable to continue treating that currently stored non-SHR lot as a non-SHR lot. In some embodiments, the RTD 420 of downstream tool 331 recognizes the precedence attribute of the non-SHR lot, and will select an SHR wafer lot from one of the other OHBs (e.g., stocker OHB 353) before selecting the non-SHR lot that was previously stored in the OHB 351 or 352 that has now been changed to an SHR OHB.

In other embodiments, the RTD 420 always selects the next wafer lot from an SHR OHB (if that SHR OHB is not empty) before selecting a wafer carrier from an EQP OHB or stocker OHB. If the OHB that is to have its category changed is not empty when the change is requested, the MES 415 waits until the OHB 351 or 352 is empty before changing the category of the OHB 351 or 352. Then the RTD 420 will treat the previously stored non-SHR wafer lot correctly as a non-SHR wafer lot.

Configuration changes are not limited to changing an existing OHB from one category to another category. The MES also permits the administrator to add one or more OHBs to the configuration at any time, or remove one or more of the OHBs. The MES provides a user interface display for the administrator to input any desired addition, deletion or substitution in the OHB configuration.

Although an embodiment with three OHB categories is described above, other embodiments include additional categories, such as a category for normal wafer lots or a category for engineering wafer lots and control wafers.

Including dynamic setup for assigning the OHBs to multiple categories can improve OHB utilization, shorten highest precedence (SHR) wafer lot cycle time and reduce lost tool operation time. Because the configuration of SHR OHBs, EQP OHBs and stocker OHBs can be varied whenever the mix and/or volume of wafers to be processed changes, there is not need to adopt a single compromise configuration that provides best overall efficiency. Rather, the configuration can be optimized for each individual processing scenario, and reconfigured whenever the scenario changes.

The AMHS described above may reduce the average cycle time for production of SHR wafer lots by 3-5%. In addition to the direct benefits described above, the AMHS described herein also has indirect benefits. Because the duty cycle and utilization of processing tools can be improved, in some cases it may be possible to achieve a desired production level with fewer tools. This may reduce the total cost of equipment, and may reduce the fab footprint.

Portions of the apparatus described above may be embodied in the form of computer-implemented processes and apparatus for practicing those processes. These elements may also be embodied in the form of computer program code embodied in tangible machine readable storage media, such as random access memory (RAM), floppy diskettes, read only memories (ROMs), CD-ROMs, DVD-ROMs, BD-ROMs, hard disk drives, flash memories, or any other machine-readable storage medium, wherein, when the computer program code is loaded into and executed by a computer, the computer becomes an apparatus for practicing the invention. These elements may also be embodied in the form of computer program code stored in a tangible storage medium, loaded into and/or executed by a computer, such that, when the computer program code is loaded into and executed by a computer, the computer becomes an apparatus for practicing the invention. When implemented on a general-purpose processor, the computer program code segments configure the processor to create specific logic circuits. Elements of the embodiments may alternatively be embodied in a digital signal processor formed of application specific integrated circuits for performing a method according to the principles of the invention.

Although the invention has been described in terms of exemplary embodiments, it is not limited thereto. Rather, the appended claims should be construed broadly, to include other variants and embodiments of the invention, which may be made by those skilled in the art without departing from the scope and range of equivalents of the invention.

What is claimed is:

1. A method comprising:
   providing an automated materials handling system having a plurality of overhead hoist buffers (OHBs) for receiving a plurality of semiconductor wafer carriers;
   assigning each OHB to a respective one of a plurality of categories, each wafer carrier being associated with one or more of the plurality of categories;
   associating each respective category with at least one of a plurality of event trigger types;
   storing each of the plurality of wafer carriers in response to a respective trigger event, each trigger event having one of the plurality of event trigger types, each wafer carrier being stored in a respective one of the plurality of OHBs assigned to a respective one of the categories associated with the respective event trigger type of the trigger event causing that wafer carrier to be stored,
   each of the categories associated with a level or type of service.

2. The method of claim 1, wherein a first one of the categories is associated with all of the event trigger types.

3. The method of claim 2, wherein an OHB assigned to the first category is reserved for a wafer carrier having a highest precedence attribute.

4. The method of claim 3, further comprising transferring a wafer carrier to the OHB assigned to the first category from an upstream tool or from a local stocker proximate to a next downstream tool in which at least one wafer from the wafer carrier is to be processed.

5. The method of claim 1, further comprising dynamically changing a category of one of the OHBs from a first one of the plurality of categories to a second one of the plurality of categories, while at least on wafer carrier is stored in that OHB.

6. The method comprising:
   providing an automated material handling system having a plurality of overhead hoist buffers (OBHs) for receiving a plurality of semiconductor wafer carriers;
   assigning each OBH to a respective one of a plurality of categories, each wafer carrier being associated with one or more of the plurality of categories;
   associating each respective category with at least one of a plurality of event trigger types;
   storing each of the plurality of wafer carriers in response to a respective trigger event, each trigger event having one of the plurality of event trigger types, each wafer carrier being stored in a respective one of the plurality of OHBs assigned to a respective one of the categories associated with the respective event trigger type of the trigger event causing the wafer carrier to be stored,
   each of the categories associated with a level or type of service, wherein a first one of the categories is associated with all of the event trigger types and a second one of the categories is associated with two of the event trigger types.

7. The method of claim 6, wherein an OHB assigned to the second category is reserved for receiving a wafer carrier from a local stocker proximate to a next downstream tool in which at least one wafer from the wafer carrier is to be processed.

8. The method of claim 7, further comprising:
   transferring a wafer carrier from the local stocker to the OHB assigned to the second category, when a wafer carrier stored in that OHB is transmitted from that OHB to a load port of the next downstream tool.

9. The method of claim 7, further comprising:
   periodically, automatically checking whether the local stocker has a wafer carrier to be stored in the OHB assigned to the second category, if that OHB is empty; and
   transferring a wafer carrier from the local stocker to the OHB assigned to the second category, when a wafer carrier to be stored in that OHB has arrived in the local stocker.

10. The method of claim 7, further comprising:
    selecting a wafer carrier having a highest priority among a plurality of wafer carriers stored in the local stocker; and
    transferring the selected wafer carrier to the OHB assigned to the second category.

11. The method of claim 6, wherein a third one of the categories is associated with a single one of the event trigger types.

12. The method of claim 11, wherein an OHB assigned to the third category is reserved for receiving a wafer carrier from an upstream tool upon completion of an upstream process, without storing the wafer carrier in a local stocker between leaving the upstream tool and arriving at the OHB assigned to the third category.

13. An automated materials handling system comprising:
    a plurality of overhead hoist buffers (OHBs) for receiving a plurality of semiconductor wafer carriers, each OHB assigned to a respective one of a plurality of categories, each wafer carrier being associated with one or more of the plurality of categories, each respective category associated with at least one of a plurality of event trigger types; and
    an overhead transport (OHT) for transporting each of the plurality of wafer carriers to a respective one of the OHBs in response to a respective trigger event, each trigger event having one of the plurality of event trigger types, each wafer carrier being stored in a respective one of the plurality of OHBs assigned to a respective one of the categories associated with the respective event trigger type of the trigger event causing that wafer carrier to be transported and stored,
    each of the categories associated with a level or type of service.

14. The system of claim 13, wherein:
    a first one of the categories is associated with all of the event trigger types;
    an OHB assigned to the first category is reserved for a wafer carrier having a highest precedence attribute; and
    the system further comprises a processor configured for controlling the OHT to transfer a wafer carrier to the OHB assigned to the first category from an upstream tool or from a local stocker proximate to a next downstream tool in which at least one wafer from the wafer carrier is to be processed.

15. The system of claim 13, wherein:
    one of the categories is associated with two of the event trigger types;
    an OHB assigned to the second category is reserved for receiving a wafer carrier from a local stocker proximate to a next downstream tool in which at least one wafer from the wafer carrier is to be processed; and the system further comprises a processor configured for controlling the OHT to transfer a wafer carrier from the local stocker to the OHB assigned to the second category, when a wafer carrier stored in that OHB is transmitted from that OHB to a load port of the next downstream tool.

16. The system of claim 13, wherein:

one of the categories is associated with two of the event trigger types;

an OHB assigned to the second category is reserved for receiving a wafer carrier from a local stocker proximate to a next downstream tool in which at least one wafer from the wafer carrier is to be processed; and the processor includes a watchdog for periodically, automatically checking whether the local stocker has a wafer carrier to be stored in the OHB assigned to the second category, if that OHB is empty; and the processor is configured for controlling the OHT to transfer a wafer carrier from the local stocker to the OHB assigned to the second category, when a wafer carrier to be stored in that OHB has arrived in the local stocker.

17. The system of claim 16, wherein the processor is configured for:

selecting a wafer carrier having a highest priority among a plurality of wafer carriers stored in the local stocker; and controlling the OHT to transfer the selected wafer carrier to the OHB assigned to the second category.

18. An automated material handling system comprising:

a plurality of overhead hoist buffers (OHBs) for receiving a plurality of semiconductor wafer carriers, each OHB assigned to a respective one of a plurality of categories, each wafer carrier being associated with one or more of the plurality of categories, each respective category associated with at least one of a plurality of event trigger types; and an overhead transport (OHT) for transporting each of the plurality of water carriers to a respective one of the OHBs in response to a respective trigger event, each trigger event having one of the plurality of event trigger types, each wafer carrier being stored in a respective one of the plurality of OHBs assigned to a respective one of the categories associated with the respective event trigger type of the trigger event causing the wafer carrier to be transported and stored, each of the categories associated with a level or type of service, wherein one of the categories is associated with a single one of the event trigger types; and an OHB assigned to the third category is reserved for receiving a wafer carrier from an upstream toot upon completion of an upstream process, without storing the wafer carrier in a local stocker between leaving the upstream tool and arriving at the OHB assigned to the third category.

19. A machine readable medium encoded with computer program code, such that when the computer program code is executed by a processor, the processor performs a method for controlling an automated materials handling system having a plurality of overhead hoist buffers (OHBs) for receiving a plurality of semiconductor wafer carriers, the method comprising:

assigning each OHB to a respective one of a plurality of categories, each wafer carrier being associated with one or more of the plurality of categories; each of the categories associated with a level or types of service;

associating each respective category with at least one of a plurality of event trigger types; and controlling the automated materials handling system for storing each of the plurality of wafer carriers in response to a respective trigger event, each trigger event having one of the plurality of event trigger types, each wafer carrier being stored in a respective one of the plurality of OHBs assigned to a respective one of the categories associated with the respective event trigger type of the trigger event causing the wafer carrier to be stored, wherein:

a first one of the categories is associated with all of the event trigger types;

a second one of the categories is associated with two of the event trigger types, and a third one of the categories is associated with a single one of the event trigger types.

\* \* \* \* \*

UNITED STATES PATENT AND TRADEMARK OFFICE
CERTIFICATE OF CORRECTION

PATENT NO. : 8,483,866 B2
APPLICATION NO. : 12/433581
DATED : July 9, 2013
INVENTOR(S) : Huang et al.

It is certified that error appears in the above-identified patent and that said Letters Patent is hereby corrected as shown below:

IN THE CLAIMS:

Claim 6, Column 11, Line 48, delete "material" and insert -- materials --.

Claim 6, Column 11, Line 49, delete "(OBH's)" and insert -- (OHB's) --.

Claim 6, Column 11, Line 51, delete "OBH" and insert -- OHB --.

Claim 6, Column 11, Line 62, delete "the wafer" and insert -- that wafer --.

Claim 18, Column 13, Line 30, delete "material" and insert -- materials --.

Claim 18, Column 13, Line 39, delete "water" and insert -- wafer --.

Claim 18, Column 14, Line 2, delete "the wafer" and insert -- that wafer --.

Claim 18, Column 14, Line 9, delete "toot" and insert -- tool --.

Claim 19, Column 14, Line 23, delete ";" after "materials" and insert -- , --.

Claim 19, Column 14, Line 24, delete "types" and insert -- type --.

Claim 19, Column 14, Line 34, delete "the wafer" and insert -- that wafer --.

Signed and Sealed this
Seventh Day of January, 2014

Margaret A. Focarino
*Commissioner for Patents of the United States Patent and Trademark Office*